US006930561B2

(12) United States Patent
Dvorak

(10) Patent No.: US 6,930,561 B2
(45) Date of Patent: Aug. 16, 2005

(54) MULTI-BAND VOLTAGE CONTROLLED OSCILLATOR

(75) Inventor: Mark D. Dvorak, Waseca, MN (US)

(73) Assignee: Honeywell International, Inc., Morristown, NY (US)

( * ) Notice: Subject to any disclaimer, the term of this patent is extended or adjusted under 35 U.S.C. 154(b) by 0 days.

(21) Appl. No.: 10/253,155

(22) Filed: Sep. 24, 2002

(65) Prior Publication Data

US 2004/0056726 A1 Mar. 25, 2004

(51) Int. Cl.$^7$ .............................................. H03B 27/00
(52) U.S. Cl. ........................... 331/49; 331/46; 331/179; 331/117 FE; 331/74
(58) Field of Search ....................... 331/49, 46, 117 FE, 331/179, 74, 108 C

(56) References Cited

U.S. PATENT DOCUMENTS 5,389,898 A * 2/1995 Taketoshi et al. ............... 331/2
5,852,384 A * 12/1998 Sakakura et al. ............. 331/48
5,856,763 A * 1/1999 Reeser et al. ................. 331/49
6,072,371 A * 6/2000 Kobayashi et al. ........... 331/49
6,157,265 A * 12/2000 Hanjani ....................... 331/49

* cited by examiner

Primary Examiner—Arnold Kinkead
(74) Attorney, Agent, or Firm—Schiff Hardin LLP

(57) ABSTRACT

A single integrated chip has first and second voltage controlled oscillators and first and second buffers. The first voltage controlled oscillator has a first output defined by a first frequency band, and the second voltage controlled oscillator has a second output defined by a second frequency band. The first and second buffers selectively couple the first and second outputs to a common output. The first buffer is coupled between the first frequency controlled oscillator and the common output, and the second buffer is coupled between the second frequency controlled oscillator and the common output. The first buffer has a high output impedance when the second buffer couples the second output to the common output, and the second buffer has a high output impedance when the first buffer couples the first output to the common output.

25 Claims, 2 Drawing Sheets

MULTI-BAND VOLTAGE CONTROLLED OSCILLATOR

TECHNICAL FIELD OF THE INVENTION

The present invention relates to a voltage controlled oscillator capable of producing an output in a selected one of multiple frequency bands.

BACKGROUND OF THE INVENTION

It is desirable to increase the level of integration of an integrated circuit, such as an integrated RF circuit designed for wireless communications, because an increase in the level of integration generally lowers the cost of an integrated circuit. One way to increase the level of integration of an integrated circuit is to design the integrated circuit as a chip that can be used in different regions of the frequency spectrum. The same integrated circuit can then be used in multiple applications.

The present invention is directed to an integrated circuit that has the capability of providing an output in different frequency bands.

SUMMARY OF THE INVENTION

In accordance with one aspect of the present invention, a single integrated chip comprises a first voltage controlled oscillator, a second voltage controlled oscillator, and first and second buffers. The first voltage controlled oscillator has a first output defined by a first frequency band. The second voltage controlled oscillator has a second output defined by a second frequency band, and the second frequency band is different from the first frequency band. The first and second buffers selectively couple the first and second outputs to a common output. The first buffer is coupled between the first frequency controlled oscillator and the common output, and the second buffer is coupled between the second frequency controlled oscillator and the common output. The first buffer has a high output impedance when the second buffer couples the second output to the common output, and the second buffer has a high output impedance when the first buffer couples the first output to the common output.

In accordance with another aspect of the present invention, a single integrated chip comprises a first voltage controlled oscillator, a second voltage controlled oscillator, an output terminal, and a selection apparatus. The first voltage controlled oscillator has a first output defined by a first frequency band. The second voltage controlled oscillator has a second output defined by a second frequency band, and the second frequency band is different from the first frequency band. The selection apparatus selectively couples the first and second outputs to the output terminal.

In accordance with still another aspect of the present invention, an integrated circuit comprises a first voltage controlled oscillator, a second voltage controlled oscillator, first and second buffers, a first transmission gate, and a second transmission gate. The first voltage controlled oscillator has a first output defined by a first frequency band. The second voltage controlled oscillator has a second output defined by a second frequency band, and the second frequency band is different from the first frequency band. The first and second buffers selectively couple the first and second outputs to a common output. The first buffer is coupled between the first frequency controlled oscillator and the common output, and the second buffer is coupled between the second frequency controlled oscillator and the common output. The first transmission gate is coupled so as to selectively control the first buffer. The second transmission gate is coupled so as to selectively control the second buffer.

BRIEF DESCRIPTION OF THE DRAWINGS

These and other features and advantages will become more apparent from a detailed consideration of the invention when taken in conjunction with the drawings in which.

DETAILED DESCRIPTION

Figure 1:
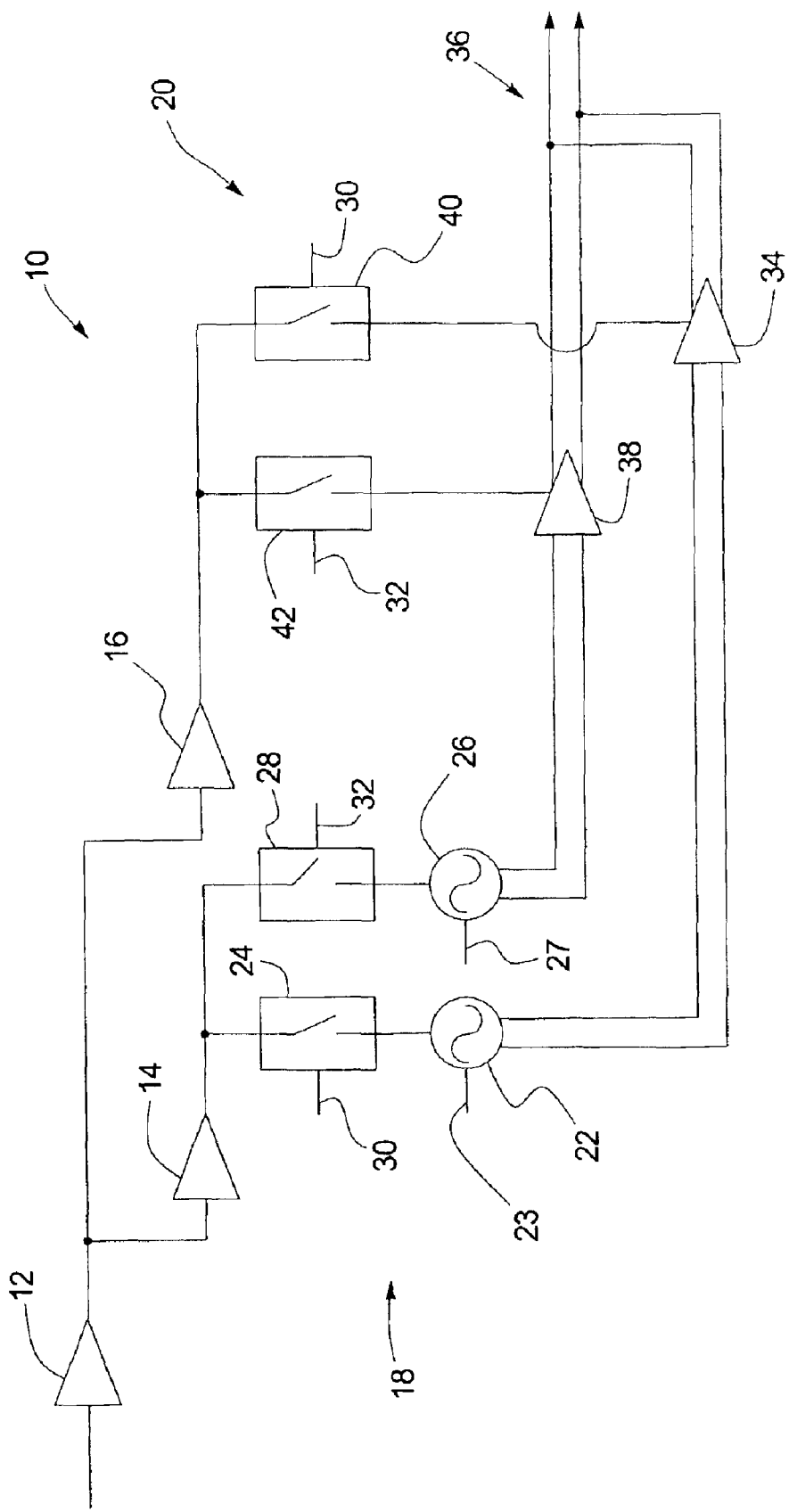
FIG. 1 illustrates a chip having a multi-band voltage controlled oscillator; and, FIG. 2 illustrates features of the chip shown in FIG. 1 in additional detail.

As shown in FIG. 1, a chip 10 includes a reference voltage generator 12 that generates an output voltage reference so that the output voltage reference is independent of temperature and supply voltage variations. The voltage reference supplied by the reference voltage generator 12 is provided to an oscillator regulator 14 and to a buffer regulator 16. The oscillator regulator 14 and the buffer regulator 16 function as stable voltage/current sources for a multi-band voltage control oscillator stage 18 and an output buffer stage 20, respectively.

The multi-band voltage control oscillator stage 18 includes a first voltage controlled oscillator 22 coupled to the output of the oscillator regulator 14 by way of a first oscillator transmission gate 24 and a second voltage controlled oscillator 26 coupled to the output of the oscillator regulator 14 by way of a second oscillator transmission gate 28. The first oscillator transmission gate 24 is responsive to a first frequency select input 30 to turn the first voltage controlled oscillator 22 on and off, and the second oscillator transmission gate 28 is responsive to a second frequency select input 32 to turn the second voltage controlled oscillator 26 on and off. The first and second oscillator transmission gates 24 and 28 may be electronic switches and generally function so that, while one of the first and second voltage controlled oscillators 22 and 26 is on, the other of the first and second voltage controlled oscillators 22 and 26 is off.

The output buffer stage 20 includes a first output buffer 34 coupled between the output of the first voltage controlled oscillator 22 and output terminals 36, and a second output buffer 38 coupled between the output of the second voltage controlled oscillator 26 and the output terminals 36. A first output buffer transmission gate 40 is coupled between a control terminal of the first output buffer 34 and the output of the buffer regulator 16, and a second output buffer transmission gate 42 is coupled between a control terminal of the second output buffer 38 and the output of the buffer regulator 16.

The first output buffer transmission gate 40 is responsive to the first frequency select input 30 to turn the first output buffer 34 on and off, and the second output buffer transmission gate 42 is responsive to the second frequency select input 32 to turn the second output buffer 38 on and off. The first and second output buffer transmission gates 40 and 42 may also be electronic switches and generally function so that, while one of the first and second output buffers 34 and 38 is on, the other of the first and second output buffers 34 and 38 is off.

The first and second voltage controlled oscillators 22 and 26 produce output signals that vary through correspondingly different frequency bands. Hence, if the first voltage controlled oscillator 22 is selected by the first frequency select input 30, the first voltage controlled oscillator 22 produces a first output signal whose frequency may be varied from frequency $f_1$ to frequency $f_2$ within the frequency band $f_1$–$f_2$. On the other hand, if the second voltage controlled oscillator 26 is selected by the second frequency select input 32, the second voltage controlled oscillator 26 produces a second output signal whose frequency may be varied from frequency $f_3$ to frequency $f_4$ within the frequency band $f_3$–$f_4$. The frequency band $f_3$–$f_4$ is different than the frequency band $f_1$–$f_2$ at least in the sense that the frequency bands $f_1$–$f_2$ and $f_3$–$f_4$ are not identical. Any known voltage controlled oscillators may be used for the first and second voltage controlled oscillators 22 and 26 as long as the components of such known voltage controlled oscillators are chosen so as to produce the two different frequency bands $f_1$–$f_2$ and $f_3$–$f_4$.

The frequency of the output signals provided by the first voltage controlled oscillator 22 may be varied by the use of one or more control lines 23. Similarly, the frequency of the output signals provided by the second voltage controlled oscillator 26 may be varied by the use of one or more control lines 27. Accordingly, this arrangement provides a continuous frequency selection capability within the frequency bands $f_1$–$f_2$ and $f_3$–$f_4$.

When the first voltage controlled oscillator 22 is selected by the first frequency select input 30, the first output buffer 34 is also selected by the first frequency select input 30 so that the output signal from the first voltage controlled oscillator 22 is provided to the output terminals 36. Similarly, when the second voltage controlled oscillator 26 is selected by the second frequency select input 32, the second output buffer 38 is also selected by the second frequency select input 32 so that the output signal from the second voltage controlled oscillator 26 is provided to the output terminals 36.

The first and second output buffers 34 and 38 provide isolation between the corresponding first and second voltage controlled oscillators 22 and 26 and downstream circuitry coupled to the output terminals 36. In order for the first and second output buffers 34 and 38 to provide such isolation, the first output buffer 34 preferably presents a high impedances to the downstream circuitry coupled to the output terminals 36 when the first output buffer 34 is off. Similarly, the second output buffer 38 preferably presents a high impedances to the downstream circuitry coupled to the output terminals 36 when the second output buffer 38 is off.

Figure 2:
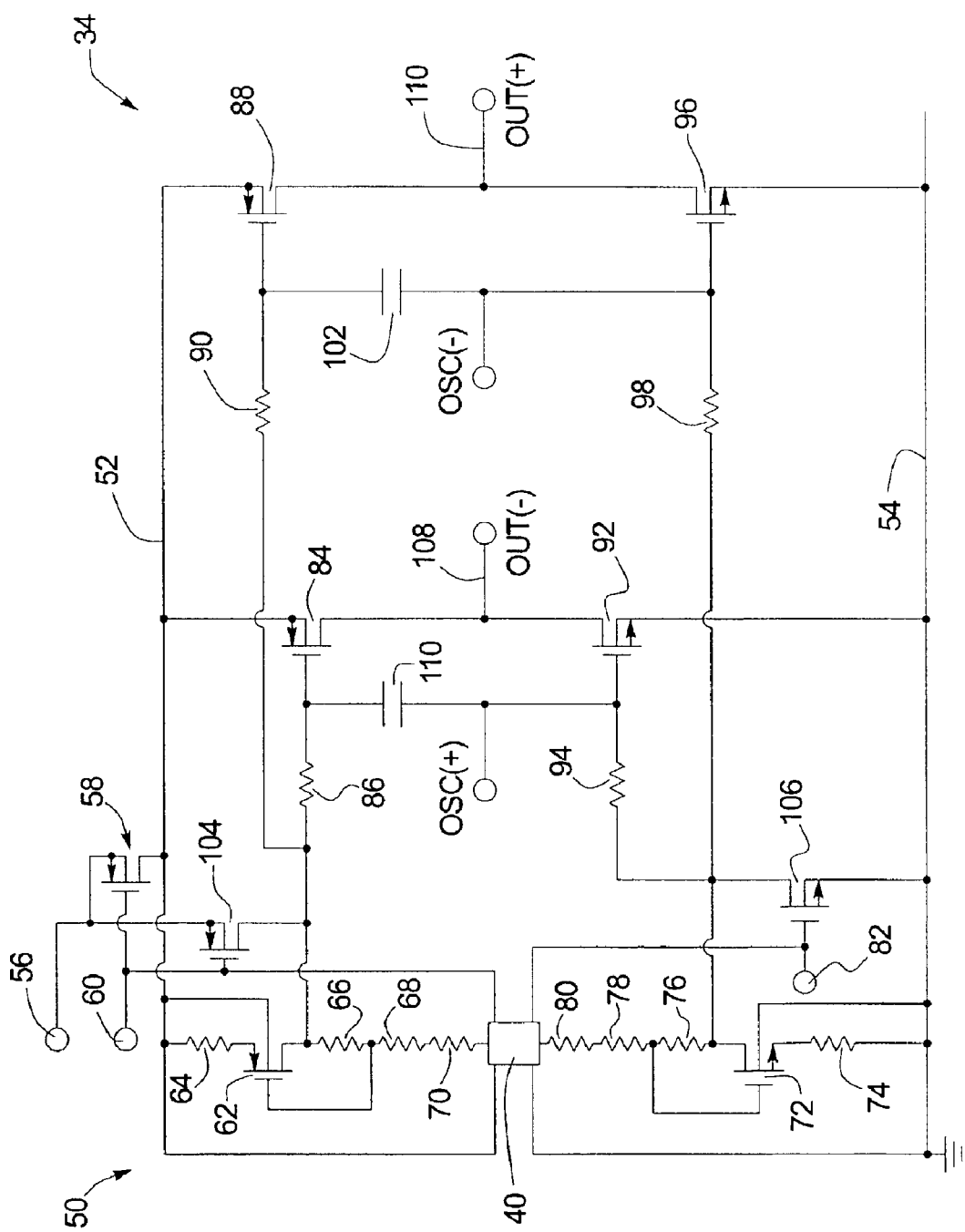

The output buffer design of FIG. 2 achieves these high impedance off states. Although the output buffer design of FIG. 2 is assumed to be the design of the first output buffer 34, it should be understood that the output buffer design of FIG. 2 could also be used for the design of the second output buffer 38.

As shown in FIG. 2, the first output buffer 34 includes a bias circuit 50 coupled between supply lines 52 and 54. The supply line 52 may be supplied with positive potential from a positive potential supply terminal 56 through a pFET 58 under control of a frequency select enable input 60 coupled to the gate of the pFET 58. The supply line 54 may be held at a reference potential such as ground.

The bias circuit 50 has a pFET 62 whose source terminal is coupled to the supply line 52 through a resistor 64 and whose drain terminal is coupled to one side of the first output buffer transmission gate 40 through series coupled resistors 66, 68, and 70. The gate of the pFET 62 is coupled to the common junction of the resistors 66 and 68. Similarly, the bias circuit 50 has an nFET 72 whose source terminal is coupled to the supply line 54 through a resistor 74 and whose drain terminal is coupled to the other side of the first output buffer transmission gate 40 through series coupled resistors 76, 78, and 80. The gate of the nFET 72 is coupled to the common junction of the resistors 76 and 78.

The first output buffer transmission gate 40 is sourced from the supply lines 52 and 54 and is controlled by the frequency select enable input 60 as well as a frequency select enable-not input 82. The frequency select enable input 60 and the frequency select enable-not input 82 form the first frequency select input 30 of FIG. 1.

The junction between the drain terminal of the pFET 62 and the resistor 66 is coupled to the gate of a pFET 84 through a resistor 86, and to the gate of a pFET 88 through a resistor 90. Similarly, the junction between the drain terminal of the nFET 72 and the resistor 76 is coupled to the gate of an nFET 92 through a resistor 94, and to the gate of an nFET 96 through a resistor 98. The source terminals of the pFET 84 and the nFET 92 are coupled to the supply lines 52 and 54, and the source terminals of the pFET 88 and the nFET 96 are coupled to the supply lines 52 and 54.

One output of the first voltage controlled oscillator 22 is coupled to the gate of the pFET 84 through a capacitor 100. This one output of the first voltage controlled oscillator 22 is also coupled directly to the gate of the nFET 92. The other output of the first voltage controlled oscillator 22 is coupled to the gate of the pFET 88 through a capacitor 102. This other output of the first voltage controlled oscillator 22 is also directly to the gate of the nFET 96.

A pFET 104 has a source terminal coupled to the positive potential supply terminal 56 and a drain terminal coupled to the gate of the pFET 84 through the resistor 86 and to the gate of the pFET 88 through the resistor 90. The gate of the pFET 104 is coupled to the frequency select enable input 60. Also, an nFET 106 has a source terminal coupled to the supply line 54 and a drain terminal coupled to the gate of the nFET 92 through the resistor 94 and to the gate of the nFET 96 through the resistor 98. The gate of the nFET 106 is coupled to the frequency select enable-not input 82.

The first output buffer 34 has an output line 108 taken from the junction of the drain terminals of the pFET 84 and the nFET 92, and the first output buffer 34 also has an output line 110 taken from the junction of the drain terminals of the pFET 88 and the nFET 96. As shown in FIG. 1, the output lines 108 and 110 are coupled to the output terminals 36.

The bias circuit 50, the pFETs 84 and 88, and the nFETs 92 and 96 achieve a high impedance state when the first output buffer 34 is off. Accordingly, when the first output buffer 34 is off, the gates of the nFETs 92 and 96 are pulled to ground, and the gates of the pFETs 84 and 88 are pulled to a high voltage. Consequently, the pFETs 84 and 88 and the nFETs 92 and 96 are in a condition where their gate to source voltages are zero so that these FETs conduct no current. Because these FETs conduct no current, their output impedance is high so that the first output buffer 34 does not load the second output buffer 38 which is active (on) when the first output buffer 34 is inactive (off).

Certain modifications of the present invention have been described above. Other modifications will occur to those practicing in the art of the present invention. For example, the chip 10 is shown with only two voltage controlled oscillators. However, the chip may be provided with a greater number of voltage controlled oscillators in order to operate over additional frequency bands.

Moreover, because the first oscillator transmission gate 24 and the first output buffer transmission gate 40 operate in unison, the first oscillator transmission gate 24 and the first output buffer transmission gate 40 may be replaced by a single transmission gate coupled both to the first voltage controlled oscillator 22 and to the first output buffer 34. Similarly, because the second oscillator transmission gate 28 and the second output buffer transmission gate 42 operate in unison, the second oscillator transmission gate 28 and the second output buffer transmission gate 42 may be replaced by a single transmission gate coupled both to the second voltage controlled oscillator 26 and to the second output buffer 38.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

I claim:

1. A single integrated chip comprising:
   a first voltage controlled oscillator having a first output defined by a first frequency band;
   a second voltage controlled oscillator having a second output defined by a second frequency band, wherein the second frequency band is different from the first frequency band; and,
   first and second buffers arranged to selectively couple the first and second outputs to a common output, wherein the first buffer is coupled between the first frequency controlled oscillator and the common output, wherein the second buffer is coupled between the second frequency controlled oscillator and the common output, wherein the first buffer is arranged to have a high output impedance when the second buffer couples the second output to the common output, and wherein the second buffer is arranged to have a high output impedance when the first buffer couples the first output to the common output.

2. The single integrated chip of claim 1 wherein a first transmission gate is coupled to the first voltage controlled oscillator, wherein a second transmission gate is coupled to the second voltage controlled oscillator, wherein a third transmission gate is coupled to the first buffer, and wherein a fourth transmission gate is coupled to the second buffer.

3. The single integrated chip of claim 1 wherein the first buffer comprises a pFET and an nFET coupled between the first frequency controlled oscillator and the common output, wherein each of the pFET and nFET of the first buffer has a gate, a source, and a drain, and wherein the pFET and the nFET of the first buffer each has a substantially zero gate to source voltage when the first buffer is off.

4. The single integrated chip of claim 3 wherein the second buffer comprises a pFET and an nFET coupled between the second frequency controlled oscillator and the common output, wherein each of the pFET and nFET of the second buffer has a gate, a source, and a drain, and wherein the pFET and the nFET of the second buffer each has a substantially zero gate to source voltage when the second buffer is off.

5. The single integrated chip of claim 4 wherein a first transmission gate is coupled to the first voltage controlled oscillator, wherein a second transmission gate is coupled to the second voltage controlled oscillator, wherein a third transmission gate is coupled to the first buffer, and wherein a fourth transmission gate is coupled to the second buffer.

6. The single integrated chip of claim 1 further comprising a reference voltage generator arranged to generate a reference voltage, wherein a first transmission gate is coupled between the reference voltage generator and the first voltage controlled oscillator, wherein a second transmission gate is coupled is coupled between the reference voltage generator and the second voltage controlled oscillator, wherein a third transmission gate is coupled is coupled between the reference voltage generator and the first buffer, and wherein a fourth transmission gate is coupled is coupled between the reference voltage generator and the second buffer.

7. The single integrated chip of claim 6 wherein the first buffer comprises a pFET and an nFET coupled between the first frequency controlled oscillator and the common output, wherein each of the pFET and nFET of the first buffer has a gate, a source, and a drain, and wherein the pFET and the nFET of the first buffer each has a substantially zero gate to source voltage when the first buffer is off.

8. The single integrated chip of claim 7 wherein the second buffer comprises a pFET and an nFET coupled between the second frequency controlled oscillator and the common output, wherein each of the pFET and nFET of the second buffer has a gate, a source, and a drain, and wherein the pFET and the nFET of the second buffer each has a substantially zero gate to source voltage when the second buffer is off.

9. The single integrated chip of claim 1 wherein the first and second frequency bands comprise overlapping frequency bands.

10. A single integrated chip comprising:
    a first voltage controlled oscillator having a first output defined by a first frequency band;
    a second voltage controlled oscillator having a second output defined by a second frequency band, wherein the second frequency band is different from the first frequency band;
    a common output, wherein the common output is common to both the first and second voltage controlled oscillators; and,
    a selection apparatus arranged to selectively couple the first and second outputs to the common output, wherein the selection apparatus presents a high output impedance between the common output and a non-selected one of the first and second outputs.

11. The single integrated chip of claim 10 wherein the selection apparatus comprises:
    a first buffer coupled between the first frequency controlled oscillator and the common output; and,
    a second buffer coupled between the second frequency controlled oscillator and the common output.

12. The single integrated chip of claim 11 wherein the first buffer has a high output impedance when the second buffer couples the second voltage controlled oscillator to the common output, and wherein the second buffer has a high output impedance when the first buffer couples the first voltage controlled oscillator to the common output.

13. The single integrated chip of claim 11 wherein a first transmission gate is coupled to the first voltage controlled oscillator and to the first buffer, and wherein a second transmission gate is coupled to the second voltage controlled oscillator and to the second buffer.

14. The single integrated chip of claim 11 wherein the first buffer comprises a pFET and an nFET coupled between the first frequency controlled oscillator and the common output, wherein each of the pFET and nFET of the first buffer has a gate, a source, and a drain, and wherein the pFET and the nFET of the first buffer each has a substantially zero gate to source voltage when the first buffer is off.

15. The single integrated chip of claim 14 wherein the second buffer comprises a pFET and an nFET coupled between the second frequency controlled oscillator and the common output, wherein each of the pFET and nFET of the second buffer has a gate, a source, and a drain, and wherein the pFET and the nFET of the second buffer each has a substantially zero gate to source voltage when the second buffer is off.

16. The single integrated chip of claim 15 wherein a first transmission gate is coupled to the first voltage controlled oscillator and the first buffer, and wherein a second transmission gate is coupled to the second voltage controlled oscillator and to the second buffer.

17. The single integrated chip of claim 11 wherein the first buffer comprises a FET coupled between the first frequency controlled oscillator and the common output, wherein the FET of the first buffer has a gate, a source, and a drain, and wherein the FET of the first buffer has a substantially zero gate to source voltage when the first buffer is off.

18. The single integrated chip of claim 17 wherein the second buffer comprises a FET coupled between the second frequency controlled oscillator and the common output, wherein the FET of the second buffer has a gate, a source, and a drain, and wherein the FET of the second buffer has a substantially zero gate to source voltage when the second buffer is off.

19. The single integrated chip of claim 10 wherein a first transmission gate is coupled to the first voltage controlled oscillator, and wherein a second transmission gate is coupled to the second voltage controlled oscillator.

20. The single integrated chip of claim 10 wherein the first and second frequency bands comprise overlapping frequency bands.

21. An integrated circuit comprising:
   a first voltage controlled oscillator having a first output defined by a first frequency band;
   a second voltage controlled oscillator having a second output defined by a second frequency band, wherein the second frequency band is different from the first frequency band;
   first and second buffers arranged to selectively couple the first and second outputs to a common output, wherein the first buffer is coupled between the first frequency controlled oscillator and the common output, and wherein the second buffer is coupled between the second frequency controlled oscillator and the common output;
   a first transmission gate coupled so as to selectively control the first buffer; and,
   a second transmission gate coupled so as to selectively control the second buffer.

22. The integrated circuit of claim 21 wherein the first buffer comprises a pFET and an nFET coupled between the first frequency controlled oscillator and the common output, wherein each of the pFET and nFET of the first buffer has a gate, a source, and a drain, and wherein the pFET and the nFET of the first buffer each has a substantially zero gate to source voltage when the first buffer is off.

23. The integrated circuit of claim 22 wherein the second buffer comprises a pFET and an nFET coupled between the second frequency controlled oscillator and the common output, wherein each of the pFET and nFET of the second buffer has a gate, a source, and a drain, and wherein the pFET and the nFET of the second buffer each has a substantially zero gate to source voltage when the second buffer is off.

24. The integrated circuit of claim 23 further comprising a third transmission gate is coupled to the first voltage controlled oscillator and a fourth transmission gate is coupled to the second voltage controlled oscillator.

25. The integrated circuit of claim 21 wherein the first and second frequency bands comprise overlapping frequency bands.

* * * * *